(12) United States Patent
Lee et al.

(10) Patent No.: US 9,274,267 B2
(45) Date of Patent: Mar. 1, 2016

(54) BACKLIGHT DEVICE, DISPLAY DEVICE INCLUDING THE SAME, AND MANUFACTURING METHOD FOR BACKLIGHT DEVICE

(71) Applicant: Samsung Display Co., Ltd., Yongin, Gyeonggi-Do (KR)

(72) Inventors: Chang Moo Lee, Yongin-si (KR); Kwang-Wook Choi, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 241 days.

(21) Appl. No.: 13/749,502

(22) Filed: Jan. 24, 2013

(65) Prior Publication Data

US 2014/0043857 A1 Feb. 13, 2014

(30) Foreign Application Priority Data

Aug. 7, 2012 (KR) ........................ 10-2012-0086334

(51) Int. Cl.
| | |
|---|---|
| *F21V 8/00* | (2006.01) |
| *H05K 13/04* | (2006.01) |
| *G02F 1/1335* | (2006.01) |
| *G02F 1/1345* | (2006.01) |

(52) U.S. Cl.
CPC ............ *G02B 6/0083* (2013.01); *G02B 6/0068* (2013.01); *G02B 6/0091* (2013.01); *G02F 1/1345* (2013.01); *G02F 1/133603* (2013.01); *H05K 13/04* (2013.01); *G02F 2001/133612* (2013.01); *Y10T 29/4913* (2015.01)

(58) Field of Classification Search
CPC .. G02B 6/0083; G02B 6/0068; G02B 6/0091; G02B 6/009; G02F 1/133308; G02F 1/133608
USPC .......... 362/610, 613, 97.1, 97.2, 97.3; 349/58
See application file for complete search history.

(56) References Cited

U.S. PATENT DOCUMENTS

| | | | |
|---|---|---|---|
| 7,948,573 B2 | 5/2011 | Kang et al. | |
| 2009/0290088 A1 | 11/2009 | Kwak | |
| 2010/0123847 A1* | 5/2010 | Jeong et al. ..................... | 349/58 |
| 2010/0271806 A1* | 10/2010 | Bae et al. ..................... | 362/97.1 |
| 2011/0007521 A1 | 1/2011 | Wu et al. | |
| 2011/0133674 A1 | 6/2011 | Yoo | |
| 2011/0273642 A1* | 11/2011 | Kweon et al. ................... | 349/62 |
| 2012/0057367 A1* | 3/2012 | Park ............................. | 362/606 |

FOREIGN PATENT DOCUMENTS

| | | |
|---|---|---|
| JP | 2009-069713 | 4/2009 |
| JP | 4760699 | 6/2011 |
| KR | 10-2009-0094683 | 9/2009 |
| KR | 10-2010-0006251 | 1/2010 |
| KR | 10-2011-0030220 | 3/2011 |
| KR | 10-2011-0118389 | 10/2011 |
| KR | 10-2012-0010727 | 2/2012 |

* cited by examiner

*Primary Examiner* — Karabi Guharay
(74) *Attorney, Agent, or Firm* — Innovation Counsel LLP

(57) ABSTRACT

A backlight device is provided. A backlight device according to an exemplary embodiment of the present invention includes: a lower cover enclosing a light guide plate and having a bottom cover and a side cover; and a printed circuit board attached to the lower cover and mounted with the light source, wherein the first opening is formed in the lower cover. The light source is inserted into the first opening and is positioned on an inner surface of the lower cover, and the printed circuit board is positioned at the outer surface of the lower cover.

15 Claims, 4 Drawing Sheets

BACKLIGHT DEVICE, DISPLAY DEVICE INCLUDING THE SAME, AND MANUFACTURING METHOD FOR BACKLIGHT DEVICE

CROSS-REFERENCE TO RELATED APPLICATION

This application claims priority to and the benefit of Korean Patent Application No. 10-2012-0086334 filed in the Korean Intellectual Property Office on Aug. 7, 2012, the entire contents of which are incorporated herein by reference.

BACKGROUND OF THE INVENTION (a) Field of the Invention

Embodiments of the present invention relate to a backlight device, a display device including the same, and a method of manufacturing a backlight device.

(b) Description of the Related Art

A display device is classified into a self-emissive display device displaying an image by emitting light by itself and a passive display device displaying an image by controlling the light emitted from a separate light source. A representative passive display device is a liquid crystal display.

Liquid crystal displays are now widely used as one type of flat panel display. A liquid crystal display has two display panels on which field generating electrodes such as pixel electrodes and a common electrode are formed, and a liquid crystal layer that is interposed between the panels, and a backlight module providing the light to the display panel having the liquid crystal layer is included. In the liquid crystal display, electro-potential is applied across the field generating electrodes so as to generate an electric field over the liquid crystal layer, and arrangement of liquid crystal molecules of the liquid crystal layer is determined by the electric field. Accordingly, the amount of the light emitted from the backlight module is controlled, thereby performing image display. The backlight module includes a light source emitting light, a light guide plate distributes the light coming from the light source to convert into planar light, and various optical films such as compensation films and diffusion films.

As a light source emitting light, a cold cathode fluorescent lamp (CCFL) and an external electrode fluorescent lamp (EEFL) are conventionally used, and recently a light emitting diode (LED) has been widely used.

When the number of light sources in the backlight module is increased, a manufacturing cost will be increased. Accordingly, a structure having minimum number of light sources has been designed. In this case, a current must be increased to compensate a weak light intensity according to the decreased number of light sources, however it causes a problem of heat generation.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments of the present invention provide a backlight device reducing excessive heating, a display device including the same, and a method of manufacturing a backlight device.

A backlight device according to an exemplary embodiment of the present invention includes: a lower cover enclosing a light guide plate and having a bottom cover and a side cover, and a printed circuit board attached to the lower cover and mounted with a light source, wherein a first opening is formed in the lower cover, the light source is inserted into the first opening and is positioned on an inner surface of the lower cover, and the printed circuit board is positioned at the outer surface of the lower cover.

The printed circuit board may be attached to the outer surface of the bottom cover.

The light source may be a side emitting type light source.

The backlight device may further include an adhesion tape, and the adhesion tape may include a second opening, the second opening may be formed at a position corresponding to the first opening, and the light source may be inserted into the first opening and the second.

The printed circuit board may be attached along an edge of the lower cover, and the light source may include a first light source and a second light source respectively disposed at both ends of the printed circuit board.

The printed circuit board may be attached to the outer surface of the side cover.

The light source may be a top emitting type light source.

The printed circuit board may be attached along an edge of the lower cover, and the light source may include a first light source and a second light source respectively disposed at both ends of the printed circuit board.

A backlight device manufacturing method according to an exemplary embodiment of the present invention includes: disposing a light guide plate on a lower cover formed with a first opening; mounting a light source on a printed circuit board (PCB); and attaching the lower cover and the printed circuit board so that the light source is inserted into the first opening and is positioned inside the lower cover.

As described, according to an exemplary embodiment of the present invention, the light source and the printed circuit board (PCB) are disposed on different surfaces with reference to the lower substrate to easily radiate heat, and the light source is inserted into the opening of the lower cover such that easy alignment may be obtained, thereby reducing a process time.

DETAILED DESCRIPTION OF THE EMBODIMENTS

Figure 1:
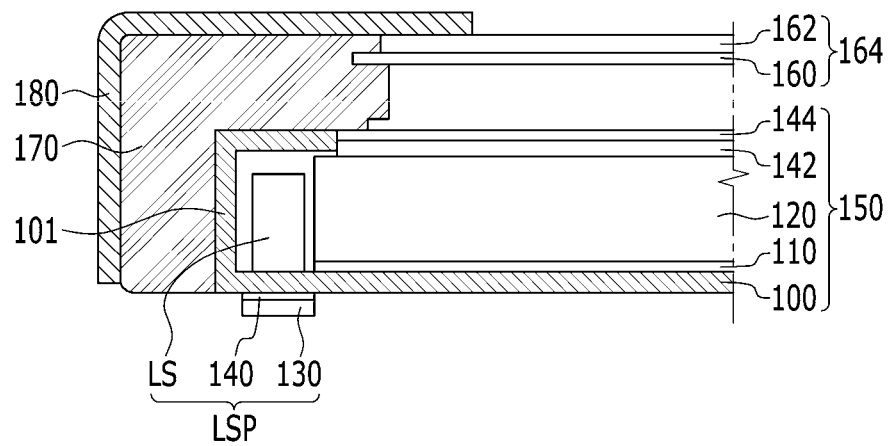
FIG. 1 is a cross-sectional view of a display device according to an exemplary embodiment of the present invention.

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

FIG. 1 is a cross-sectional view of a display device according to an exemplary embodiment of the present invention.

The display device according to an exemplary embodiment of the present invention may include a display panel 164 displaying image, a backlight device 150 providing light to the display panel 164, and an upper cover 180 and a lower cover 100 enclosing the display panel 164 and the backlight device 150.

The upper cover 180 is bent to enclose a non-display area of the display panel 164 and a side surface of the lower cover 110. A support member 170 may be formed between the upper cover 180 and the lower cover 110. The display panel 164 controls light transmittance from the backlight device 150 according to an image signal to display the image. The display device according to the present exemplary embodiment may be a liquid crystal display. In the case of the liquid crystal display, the display panel 164 may include a liquid crystal layer (not shown) formed between a lower substrate 160 and an upper substrate 162, and a spacer (not shown) uniformly maintaining an interval between the lower substrate 160 and the upper substrate 162.

The upper substrate 162 may include a color filter, a black matrix, and a common electrode.

The lower substrate 160 may include a thin film transistor and a pixel electrode connected to the thin film transistor. Here, according to a mode of a liquid crystal, the common electrode formed in the upper substrate 162 may be formed in the lower substrate 160, and the color filter or the black matrix formed in the upper substrate 162 may be formed in the lower substrate 160 to improve an aperture ratio.

The backlight device 150 includes a light guide plate 120 redistributing light emitted from a light source LS into planar light and supplying it to the overlying display panel 164, a diffuser sheet 142 positioned on the light guide plate 120 and scattering the light emitted from the light guide plate 120 to radiate uniform light, a reflection sheet 110 positioned under the light guide plate 120, reflecting leakage light in an opposite side to the display panel 164 to transmit the light to the light guide plate 120, and a prism sheet 144 positioned on the diffuser sheet 142 and collecting the light diffused in the diffuser sheet 142.

In the present exemplary embodiment, the light source LS is mounted on a printed circuit board (PCB) 130, and the lower cover 100 and the printed circuit board (PCB) 130 are attached by tape 140. Here, the tape 140 may be double-sided adhesive tape. The light source LS may receive power and an electric signal through the printed circuit board (PCB) 130, and a light source unit LSP including the light source LS and the printed circuit board (PCB) 130 may be disposed along one side of the light guide plate 120. Here, the light source LS may be a light emitting diode (LED).

The light source LS is positioned on the upper surface of the lower cover 100, and the printed circuit board (PCB) 130 is positioned under the lower surface of the lower cover 100. Although not shown in FIG. 1, the light source LS passes through the first opening and the second opening respectively formed in the lower cover 100 and the tape 140 such that most of the light source LS is disposed on the upper surface of the lower cover 100. In the present exemplary embodiment, the light source unit LSP is a side emitting type backlight unit.

The lower cover 100 includes a side cover 101 having a "⊏" shape at an edge thereof, and the side cover 101 covers the rest of the surfaces except for the surface toward the light guide plate 120 of the light source LS thereby preventing light leakage.

Next, a backlight device according to the present exemplary embodiment will be described with reference to FIG. 2 and FIG. 3.

Figure 2:
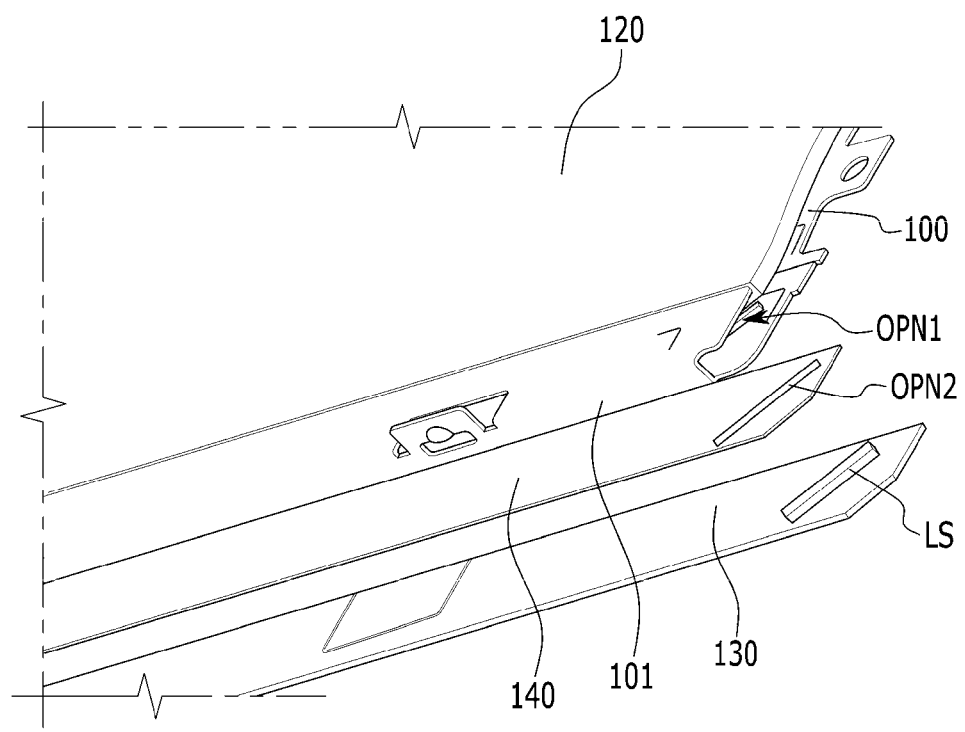
FIG. 2 is an exploded perspective view of a backlight device according to an exemplary embodiment of the present invention.

FIG. 2 is an exploded perspective view of a backlight device according to an exemplary embodiment of the present invention. Referring to FIG. 2, in the backlight device according to the present exemplary embodiment, a first opening OPN1 is formed in a corner of the lower cover 100. The first opening OPN1 extends along a diagonal direction of the edge of the lower cover 100, and have a substantially the same plane shape with the light source LS. The light source LS mounted on the printed circuit board (PCB) 130 is inserted into the first opening OPN1 and disposed on the upper surface of the lower cover 100.

The tape 140 having a second opening OPN2 is disposed between the printed circuit board (PCB) 130 and the lower cover 100. The printed circuit board (PCB) 130 and the lower cover 100 may be attached by the tape 140. The light source LS mounted on the printed circuit board (PCB) is inserted into the first opening OPN1 and is disposed on the upper surface of the lower cover 100. In other words, the light source LS is sequentially inserted into the second opening OPN2 and the first opening OPN1 and is disposed on the upper surface of the lower cover 100. The first opening OPN1 and the second opening OPN1 extend in the same direction as the light source LS, and may have the same shape as the plane shape of the light source LS.

Figure 3:
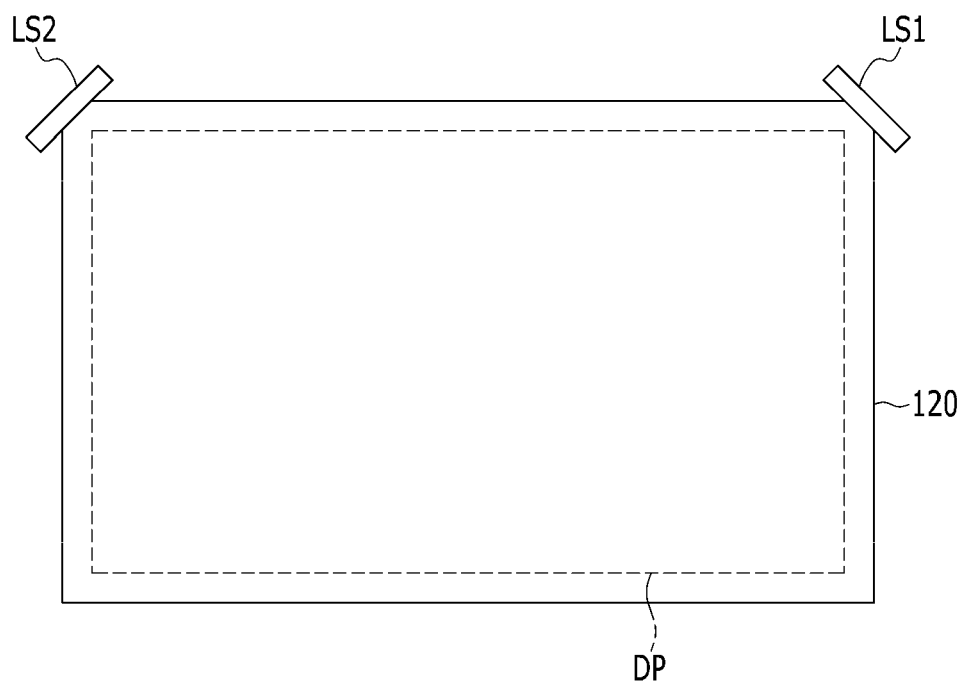
FIG. 3 is a top plan view of a backlight device according to an exemplary embodiment of the present invention.

FIG. 3 is a top plan view of a backlight device according to an exemplary embodiment of the present invention. FIG. 3 omits other constitutions to explain the arrangement of the light guide plate and the light source.

Referring to FIGS. 2 and 3, the light guide plate 120 of the backlight device according to an exemplary embodiment of the present invention is a rectangle, and two corners of the rectangle are cut to be chamfered. The light sources LS1 and LS2 are disposed at the chamfered portion of the light guide plate 120 thereby uniformly transmitting the light to the display unit DP. The light sources LS1 and LS2 are respectively disposed at both ends of the printed circuit board (PCB) 130. The printed circuit board (PCB) 130 may include a first printed circuit board (PCB) and a second printed circuit board (PCB). The first PCB and the second PCB may be connected by a flexible printed circuit film. The first light source LS1 and the second light source LS2 may be respectively mounted on the first printed circuit board (PCB) and the second printed circuit board (PCB), and the flexible printed circuit film may transmit power and electric signals to the light sources LS1 and LS2 through the first and the second printed circuit boards (PCB). The corner of the light guide plate 120 may not be chamfered, and the light sources LS1 and LS2 may be disposed at positions neighboring the corner of the light guide plate 120.

In the backlight device according to an exemplary embodiment of the present invention the light sources LS1 and LS2 may be disposed at the corner of the light guide plate 120 to reduce manufacturing cost. However, when the number of light sources LS1 and LS2 is reduced, a current must be increased to compensate weak light intensity, and it causes a problem of heat generation. To solve this problem, according to the exemplary embodiment shown in FIG. 1 to FIG. 3, the light source LS is disposed on the upper surface of the lower cover 100 and the printed circuit board (PCB) 130 is disposed under the lower surface of the lower cover 100 such that the heat generated in the light source unit LSP may be easily dissipated through the lower cover 100, and the printed circuit board (PCB) 130 is not covered by the lower cover 100 such that the heat may be radiated through the uncovered printed circuit board (PCB) 130 by a convection process. Accordingly, heat generation problem of the light source can be solved when using a less number of light sources and simultaneously high luminance may be obtained without the heating generation problem.

Also, a decrease of strength of the lower cover 100 may be minimized by using a less number of light sources and a smaller size of openings in the lower cover 100.

Figure 4:
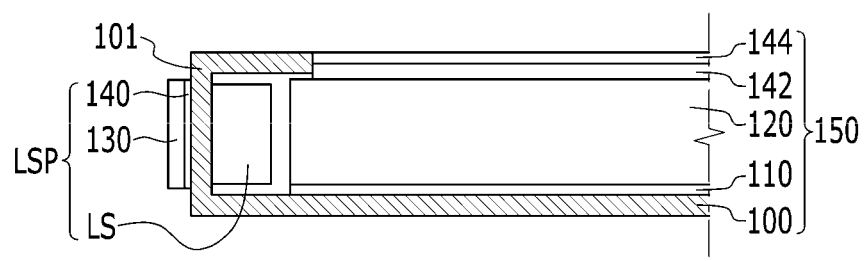
FIG. 4 is a cross-sectional view of a backlight device according to an exemplary embodiment of the present invention.

FIG. 4 is a cross-sectional view of a backlight device according to an exemplary embodiment of the present invention.

Referring to FIG. 4, the backlight device is the same as most of the backlight device shown in FIG. 1, except using a top emitting type backlight unit rather than the side emitting type backlight unit. In other words, the light source LS may be disposed on the right surface of the side cover 101 of the lower cover 100, and the printed circuit board (PCB) 130 may be disposed on the left surface of the side cover 101 of the lower cover 100.

Next, a manufacturing method of the backlight device according to an exemplary embodiment of the present invention will be described with reference to FIG. 2.

Referring to FIG. 2, the light guide plate 120 is disposed on the lower cover 100 having the first opening OPN1. The first opening OPN1 may extend along a diagonal direction of the edge of the lower cover 100.

The light source LS is mounted on the printed circuit board (PCB) 130 by using a surface mounting technique (SMT), and the printed circuit board (PCB) 130 and the lower cover 100 are attached by using the tape 140 having the second opening OPN2. At this time, the light source LS mounted on the printed circuit board (PCB) 130 is inserted into the second opening OPN2 and the first opening OPN1 and is disposed on the upper surface of the lower cover 100, and the printed circuit board (PCB) 130 is disposed under the lower surface of the lower cover 100 while being attached to the lower cover 100 by the tape 140. The method of attachment is not limited to using the tape and various methods of attachment can be used to attach the printed circuit board (PCB) to the lower cover 100.

As shown in the present exemplary embodiment because the light source LS mounted on the printed circuit board (PCB) 130 is inserted through the first opening OPN1 formed in the lower cover 100 and the second opening OPN2 formed on the tape it is very convenient to align the light source LS and the light guiding plate 120. Accordingly, a process required for the alignment may be omitted such that process time may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A backlight device comprising:
    a lower cover enclosing a light guide plate and having a bottom cover and a side cover; and
    a printed circuit board attached to the bottom cover of the lower cover and mounted with a light source,
    wherein a first opening is formed in the bottom cover of the lower cover and extends along a diagonal direction with respect to an edge of the lower cover,
    the light source is inserted into the first opening and is positioned on an inner surface of the bottom cover of the lower cover, and the printed circuit board is positioned at an outer surface of the bottom cover of the lower cover.

2. The backlight device of claim 1,
    wherein the printed circuit board is attached to the outer surface of the bottom cover.

3. The backlight device of claim 2,
    wherein the light source is a side emitting type light source.

4. The backlight device of claim 3,
    further comprising an adhesion tape,
    wherein the adhesion tape includes a second opening, the second opening is formed at a position corresponding to the first opening, and the light source is inserted into the first opening and the second opening.

5. The backlight device of claim 4,
    wherein the printed circuit board is attached along an edge of the bottom cover, and the light source includes a first light source and a second light source respectively disposed at both ends of the printed circuit board.

6. The backlight device of claim 5,
    wherein the first opening and the second opening extend in a same direction as the light source.

7. The backlight device of claim 1 wherein the light guide plate is rectangular and two corners of the rectangle are cut to be chamfered.

8. The backlight device of claim 7 wherein the light source includes a first light source and a second light source respectively disposed at both ends of the printed circuit board.

9. The backlight device of claim 8 wherein the first light source and the second light source are disposed at the chamfered corners of the light guide plate.

10. The backlight device of claim 1, wherein the light source comprises a light emitting diode, the light emitting diode being partially located within the first opening.

11. A method of manufacturing a backlight device comprising:
    disposing a light guide plate on a lower cover having a bottom cover and a side cover, the bottom cover being formed with a first opening that extends along a diagonal direction with respect to an edge of the lower cover;
    mounting a light source on a printed circuit board; and
    attaching the lower cover and the printed circuit board so that the light source is inserted into the first opening and is positioned inside the lower cover.

12. The method of claim 11 wherein the light guide plate is rectangular and two corners of the rectangle are cut to be chamfered.

13. The method of claim 12 wherein the light source includes a first light source and a second light source respectively disposed at both ends of the printed circuit board.

14. The method of claim 13 wherein the first light source and the second light source are disposed at the chamfered corners of the light guide plate.

15. The method of claim 11, wherein the light source comprises a light emitting diode, the attaching comprising partially locating the light emitting diode within the first opening.

* * * * *